(12) United States Patent
Choi et al.

(10) Patent No.: US 11,271,584 B2
(45) Date of Patent: Mar. 8, 2022

(54) INTEGRATED CIRCUIT, ELECTRONIC DEVICE INCLUDING THE SAME, AND OPERATING METHOD THEREOF

(71) Applicant: KOREA ADVANCED INSTITUTE OF SCIENCE AND TECHNOLOGY, Daejeon (KR)

(72) Inventors: Jaehyouk Choi, Daejeon (KR); Taeho Seong, Daejeon (KR); Yongsun Lee, Daejeon (KR); Chanwoong Hwang, Daejeon (KR); Hangi Park, Daejeon (KR)

(73) Assignee: Korean Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/159,197

(22) Filed: Jan. 27, 2021

(65) Prior Publication Data

US 2022/0014208 A1    Jan. 13, 2022

(30) Foreign Application Priority Data

Jul. 8, 2020  (KR) .......................... 10-2020-0084110
Dec. 22, 2020  (KR) .......................... 10-2020-0181131

(51) Int. Cl.
  *H03M 3/00*  (2006.01)
  *G04F 10/00*  (2006.01)

(52) U.S. Cl.
  CPC .......... *H03M 3/322* (2013.01); *G04F 10/005* (2013.01); *H03M 3/436* (2013.01)

(58) Field of Classification Search
  CPC ........ H03M 3/322; H03M 3/436; H03M 3/50; H03M 1/66; G04F 10/005
  (Continued)

(56) References Cited

U.S. PATENT DOCUMENTS 9,041,443 B2 *  5/2015  Jang ........................ H03L 7/193
                                                        327/156
9,362,936 B1 *  6/2016  Caffee .................... H03K 5/135
(Continued)

OTHER PUBLICATIONS

Taeho Seong et al. "17.3: A-58dBc-Worst Fractional Spur and-234dB-FOMJIT, 5.5GHz-Ring-DCO Based Fractional-N DPLL Using a Time-Invariant-Probability Modulator, Generating a Nonlinearity Robust DTC-Control Word" IEEE, International Solid-State Circuits Conference 2020.

*Primary Examiner* — Jean B Jeanglaude
(74) *Attorney, Agent, or Firm* — Harness, Dickey & Pierce, P.L.C

(57) ABSTRACT

Disclosed is an integrated circuit, which includes a DTC block including DTCs, receiving a first reference signal and a first division signal, and outputting a second reference signal and a second division signal based on the first reference signal, the first division signal, and control codes, a TDC comparing phases of the second reference signal and the second division signal and outputting a comparison signal, a digital loop filter filtering the comparison signal, an oscillator generating an output signal based on the filtered comparison signal, a delta-sigma modulator outputting a first signal and a quantized noise signal based on first and second division ratio signals, a divider dividing a frequency of the output signal based on the first signal and outputting the first division signal, and a probability modulator generating the control codes based on the quantized noise signal. Probability density functions of the control codes are time-invariant.

20 Claims, 8 Drawing Sheets

(58) Field of Classification Search
USPC .................................................. 341/143, 155
See application file for complete search history.

(56) References Cited

U.S. PATENT DOCUMENTS

| | | | | |
|---|---|---|---|---|
| 9,531,394 | B1* | 12/2016 | Caffee | G06F 1/022 |
| 10,158,367 | B1* | 12/2018 | Yu | H03L 7/235 |
| 2014/0266341 | A1* | 9/2014 | Jang | H03L 7/085 |
| | | | | 327/156 |
| 2016/0156362 | A1* | 6/2016 | Kim | H03L 7/189 |
| | | | | 327/159 |
| 2016/0373120 | A1* | 12/2016 | Caffee | H03L 7/183 |
| 2017/0338826 | A1* | 11/2017 | Hashimoto | H03L 7/189 |
| 2017/0346493 | A1 | 11/2017 | Markulic et al. | |
| 2018/0375523 | A1* | 12/2018 | Yu | H03L 7/197 |
| 2020/0212918 | A1 | 7/2020 | Elkholy | |

* cited by examiner

INTEGRATED CIRCUIT, ELECTRONIC DEVICE INCLUDING THE SAME, AND OPERATING METHOD THEREOF

CROSS-REFERENCE TO RELATED APPLICATIONS

This application claims priority under 35 U.S.C. § 119 to Korean Patent Application Nos. 10-2020-0084110 filed on Jul. 8, 2020, and 10-2020-0181131 filed on Dec. 22, 2020, in the Korean Intellectual Property Office, the disclosures of which are incorporated by reference herein in their entireties.

BACKGROUND

Embodiments of the present disclosure described herein relate to an integrated circuit, an electronic device including the same, and an operating method thereof, and more particularly, relate to a fractional-N digital phase locked loop.

A phase locked loop may generate a signal locked to a target frequency, based on a signal having a reference frequency. The phase locked loop may generate signals having frequencies required by various electronic devices such as a communication system and a processor. To tune the frequency of the generated signal more finely, a fractional-N phase locked loop may further include a delta-sigma ($\Delta\Sigma$) modulator for adjusting a division ratio of the generated signal in units of division.

As a loop bandwidth of the fractional-N phase locked loop decreases, a quantized noise may be further removed, while a noise of an oscillator included in the fractional-N phase locked loop is less filtered. To generate a signal accurately locked to a target frequency, the fractional-N phase locked loop may further include a digital-time converter for removing a quantized noise of a high frequency generated from the sigma-delta modulator.

SUMMARY

Embodiments of the present disclosure provide an integrated circuit for preventing a fractional spur from occurring due to non-linearity of a digital-time converter, and an electronic device including the same, and an operating method thereof.

According to an embodiment, an integrated circuit may include a digital-to-time converter (DTC) block that includes a plurality of DTCs, receives a first reference signal and a first division signal, and outputs a second reference signal and a second division signal based on the first reference signal, the first division signal, and a plurality of control codes, a time-to-digital converter (TDC) that compares a phase of the second reference signal and a phase of the second division signal and outputs a comparison signal, a digital loop filter that filters the comparison signal, an oscillator that generates an output signal based on the filtered comparison signal, a delta-sigma modulator that outputs a first signal and a quantized noise signal based on a first division ratio signal and a second division ratio signal, a divider that divides a frequency of the output signal based on the first signal and outputs the first division signal, and a probability modulator that generates the plurality of control codes based on the quantized noise signal, and probability density functions of the plurality of control codes may be time-invariant.

According to an embodiment, an electronic device may include a processor, and a communication device that receives data from the outside under control of the processor. The communication device may include a delta-sigma modulator that outputs a first signal and a quantized noise signal based on a first division ratio signal and a second division ratio signal, a probability modulator that generates a plurality of control codes based on the quantized noise signal, a digital-to-time converter (DTC) block that includes a plurality of DTCs, receives a first reference signal and a first division signal, and outputs a second reference signal and a second division signal based on the first reference signal, the first division signal, and the plurality of control codes, a time-to-digital converter (TDC) that compares a phase of the second reference signal and a phase of the second division signal and outputs a comparison signal, a digital loop filter that filters the comparison signal, an oscillator that generates an output signal based on the filtered comparison signal, and a circuit block that receives the first signal and the output signal and generates the first division signal from the output signal in response to the first signal. Probability density functions of the plurality of control codes may be time-invariant.

According to an embodiment, a method may include generating a plurality of control codes based on a first signal associated with a quantized noise of a delta-sigma modulator, delaying a reference signal and a division signal in a time domain based on the plurality of control codes, respectively, and generating an output signal based on the delayed reference signal and the delayed division signal, and probability density functions of the plurality of control codes may be time-invariant.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one skilled in the art easily implements the present disclosure.

Hereinafter, embodiments of the present disclosure will be described in detail with reference to accompanying drawings. In describing the present disclosure, to make the overall understanding easy, similar components/elements will be marked by similar reference signs/numerals in drawings, and thus, additional description will be omitted to avoid redundancy.

Figure 1:
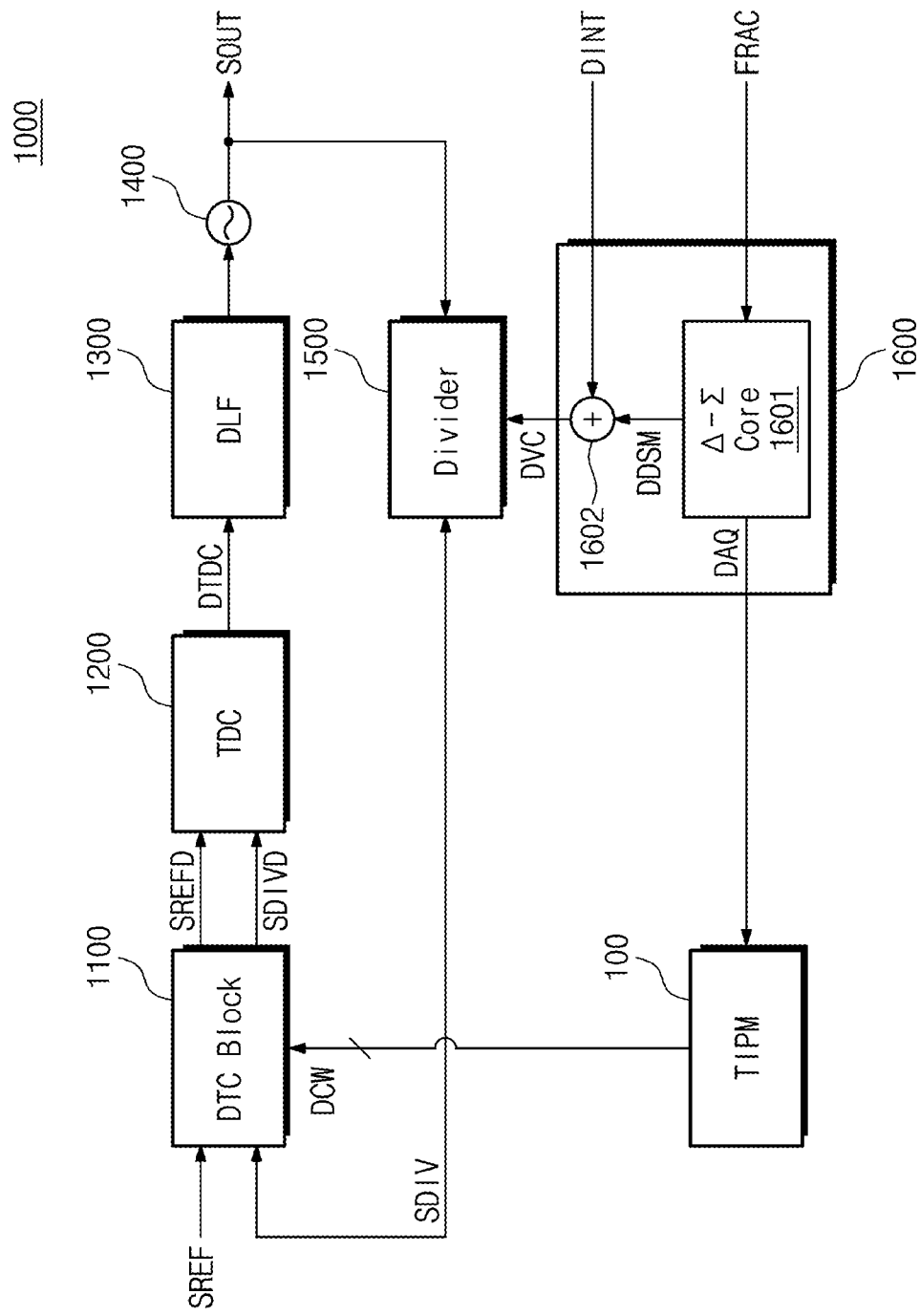
FIG. 1 is a block diagram of an integrated circuit according to an embodiment of the present disclosure.

FIG. 1 is a block diagram of an integrated circuit according to an embodiment of the present disclosure. Referring to FIG. 1, an integrated circuit 1000 may include a digital-time converter (DTC) block 1100, a time-digital converter (TDC) 1200, a digital loop filter (DLF) 1300, a digital-controlled oscillator (DCO) 1400, a divider 1500, a delta-sigma modulator 1600, and a time invariant probability modulator (TIPM) 100. In an embodiment, the integrated circuit 1000 may be referred to as a "phase locked loop (PLL)" or a "fractional-N phase locked loop".

The DTC block 1100 may include a plurality of DTCs. The DTC block 1100 may receive a reference signal SREF and a division signal SDIV. The reference signal SREF may be received from a voltage generator circuit (not illustrated) included in the integrated circuit 1000 or may be received from an external device of the integrated circuit 1000. The DTC block 1100 may receive a plurality of control codes DCW from the TIPM 100. The DTC block 1100 may delay the reference signal SREF and the division signal SDIV based on the received control codes DCW. For example, in response to the control codes DCW, the DTC block 1100 may generate analog signals by delaying the reference signal SREF and the division signal SDIV in a time domain as much as a given time, respectively. Lengths of delay times of the reference signal SREF and the division signal SDIV may be based on the control codes DCW. The DTC block 1100 may transfer a delayed reference signal SREFD and a delayed division signal SDIVD. In an embodiment, the DTC block 1100 may include digital-time converters, the number of which is the same as the number of control codes DCW provided from the TIPM 100.

The TDC 1200 may receive the delayed reference signal SREFD and the delayed division signal SDIVD from the DTC block 1100. The TDC 1200 may compare a phase of the delayed reference signal SREFD and a phase of the delayed division signal SDIVD. The TDC 1200 may output a comparison signal DTDC to the digital loop filter 1300 based on a comparison result. In an embodiment, the comparison signal DTDC may be a digital signal. In an embodiment, the integrated circuit 1000 may include a phase comparator or a sub-sampler instead of the TDC 1200.

The digital loop filter 1300 may receive the comparison signal DTDC from the TDC 1200. The digital loop filter 1300 may filter the comparison signal DTDC. In an embodiment, the digital loop filter 1300 may include a first path and a second path. The first path may filter a phase noise of the comparison signal DTDC. The second path may filter an offset of a frequency domain of the comparison signal DTDC introduced to the DCO 1400 from the TDC 1200 through the digital loop filter 1300.

In an embodiment, the integrated circuit 1000 may further include a loop gain controller (not illustrated). The digital loop filter 1300 may operate under control of the loop gain controller. For example, a gain of the DCO 1400 may change due to a process, voltage and temperature (PVT) variation of the integrated circuit 1000. To compensate for the changed gain of the DCO 1400, the loop gain controller may control an operation of the digital loop filter 1300. The loop gain controller may adjust the degree to which the comparison signal DTDC is filtered, based on various algorithms such as a least mean square (LMS) algorithm. For example, the loop gain controller may control the digital loop filter 1300 such that an autocorrection coefficient of the comparison signal DTDC is minimized.

The DCO 1400 may output an output signal SOUT based on the signal filtered by the digital loop filter 1300. For example, a frequency of the output signal SOUT may be adjusted by the signal filtered by the digital loop filter 1300. In an embodiment, the DCO 1400 may be implemented as an LC oscillator or a ring oscillator.

In an embodiment, as a phase noise is filtered by the first path of the digital loop filter 1300 described above, a low-noise characteristic of the output signal SOUT of the DCO 1400 may be satisfied. As a frequency offset is filtered by the second path of the digital loop filter 1300, a frequency of the output signal SOUT of the DCO 1400 may be adjusted to a target frequency.

The divider 1500 may receive the output signal SOUT from the DCO 1400. The divider 1500 may receive a divider control code DVC that is based on a fractional signal FRAC and an integer signal DINT. The divider 1500 may divide a frequency of the output signal SOUT based on the divider control code DVC. The divider 1500 may output the division signal SDIV to the DTC block 1100. According to the above description, the output signal SOUT that is generated through the DTC block 1100, the TDC 1200, the digital loop filter 1300, and the DCO 1400 based on the reference signal SREF may again be fed back to the DTC block 1100 based on the fractional signal FRAC and the integer signal DINT. Through iterative feedback operations, a frequency of the output signal SOUT may be adjusted to a target frequency corresponding to the fractional signal FRAC and the integer signal DINT. Below, the DTC block 1100, the TDC 1200, the digital loop filter 1300, the DCO 1400, and the divider 1500 may be referred to as a "feedback loop".

In an embodiment, the divider 1500 may be implemented as, but is not limited to, a multi-modulus divider (MMD).

In another embodiment, the integrated circuit 1000 may include a phase selector instead of the divider 1500. In this case, the integrated circuit 1000 may be referred to as a "subsampling PLL circuit". The MMD or the phase selector may be referred to as a "circuit block".

The delta-sigma modulator 1600 may generate the divider control code DVC for controlling the divider 1500. The delta-sigma modulator 1600 may include a core circuit 1601 and an adder 1602.

The core circuit 1601 may receive the fractional signal FRAC from the external device of the integrated circuit 1000. The fractional signal FRAC may be a signal associated with a frequency to be obtained through the divider 1500. For example, the fractional signal FRAC may be a signal corresponding to a fractional part of a division ratio of the divider 1500. The core circuit 1601 may generate a signal DDSM that is based on the fractional signal FRAC. The signal DDSM may be output to the adder 1602.

The adder 1602 may perform an addition operation on the signal DDSM and the integer signal DINT. The integer signal DINT may be a signal associated with the frequency to be obtained through the divider 1500. For example, the integer signal DINT may be a signal corresponding to an integer part of the division ratio of the divider 1500. The adder 1602 may output the divider control code DVC to the divider 1500 as a result of the addition operation.

In an embodiment, the delta-sigma modulator 1600 may be implemented as, but is not limited to, one of modulators having various orders, such as MASH (Multi-stAge noise SHaping)1, MASH1-1, and MASH1-1-1.

The delta-sigma modulator 1600 may generate a quantized noise signal DAQ by accumulating the signal DDSM. For example, the delta-sigma modulator 1600 may include an accumulator capable of accumulating a difference between the fractional signal FRAC and the signal DDSM. Unlike the embodiment illustrated in FIG. 1, the accumulator may be present outside the delta-sigma modulator 1600. The quantized noise signal DAQ may be generated based on the accumulated difference. The quantized noise signal DAQ may be associated with a noise that is generated as the delta-sigma modulator 1600 generates the signal DDSM. The delta-sigma modulator 1600 may output the quantized noise signal DAQ to the TIPM 100.

The TIPM 100 may receive the quantized noise signal DAQ from the delta-sigma modulator 1600. The TIPM 100 may generate the plurality of control codes DCW based on the quantized noise signal DAQ. The TIPM 100 may output the generated control codes DCW to the DTC block 1100.

In an embodiment, probability density functions of the control codes DCW generated by the TIPM 100 may have a time-invariant characteristic. For example, at times t1 and t2, a probability density function of a control code DCWa may satisfy an equation below.

$$PDF[DCWa]|_{t=t1}=PDF[DCWa]|_{t=t2}$$

At the same time, a linear combination of the control codes DCW may correspond to the quantized noise signal DAQ.

In some embodiments, the DTC block 1100 may be non-linear. By generating the control codes DCW based on the quantized noise signal DAQ, the TIPM 100 may prevent a fractional spur from occurring due to non-linearity of the DTC block 1100. A relationship between the control codes DCW generated by the TIPM 100 and the non-linearity of the DTC block 1100 will be more fully described later.

Figure 2A:
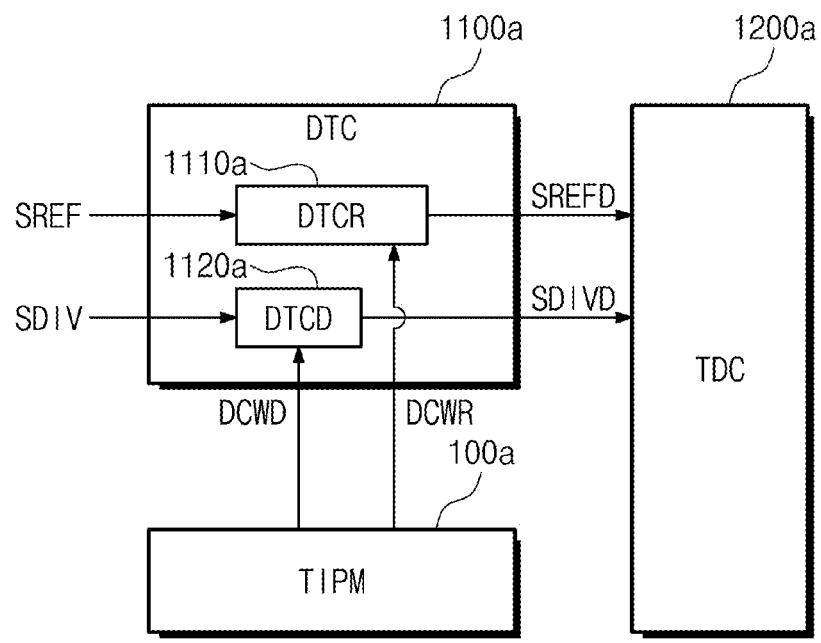
FIG. 2A is a block diagram of a digital-time converter, a time-digital converter, and a time-invariant probability modulator according to an embodiment of the present disclosure.
Figure 2B:
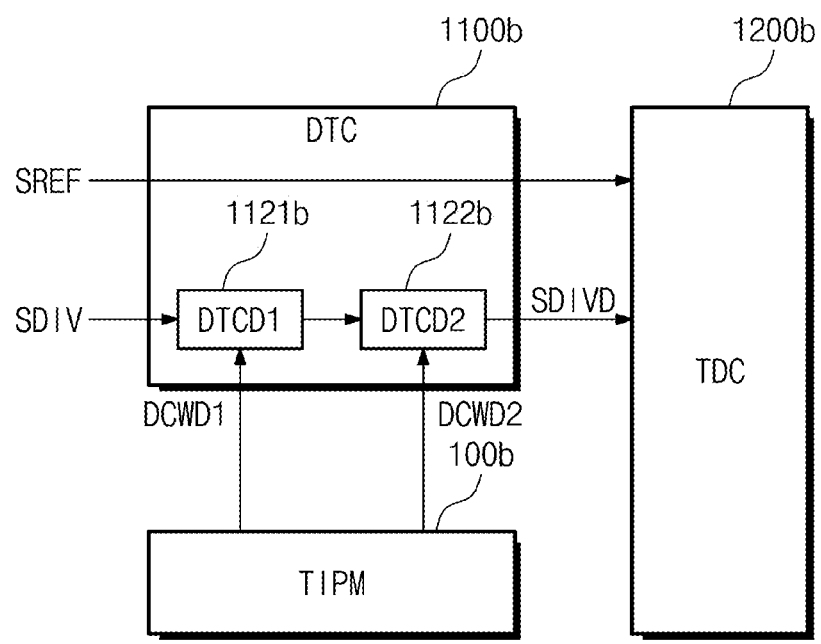
FIG. 2B is a block diagram of a digital-time converter, a time-digital converter, and a time-invariant probability modulator according to another embodiment of the present disclosure.
Figure 2C:
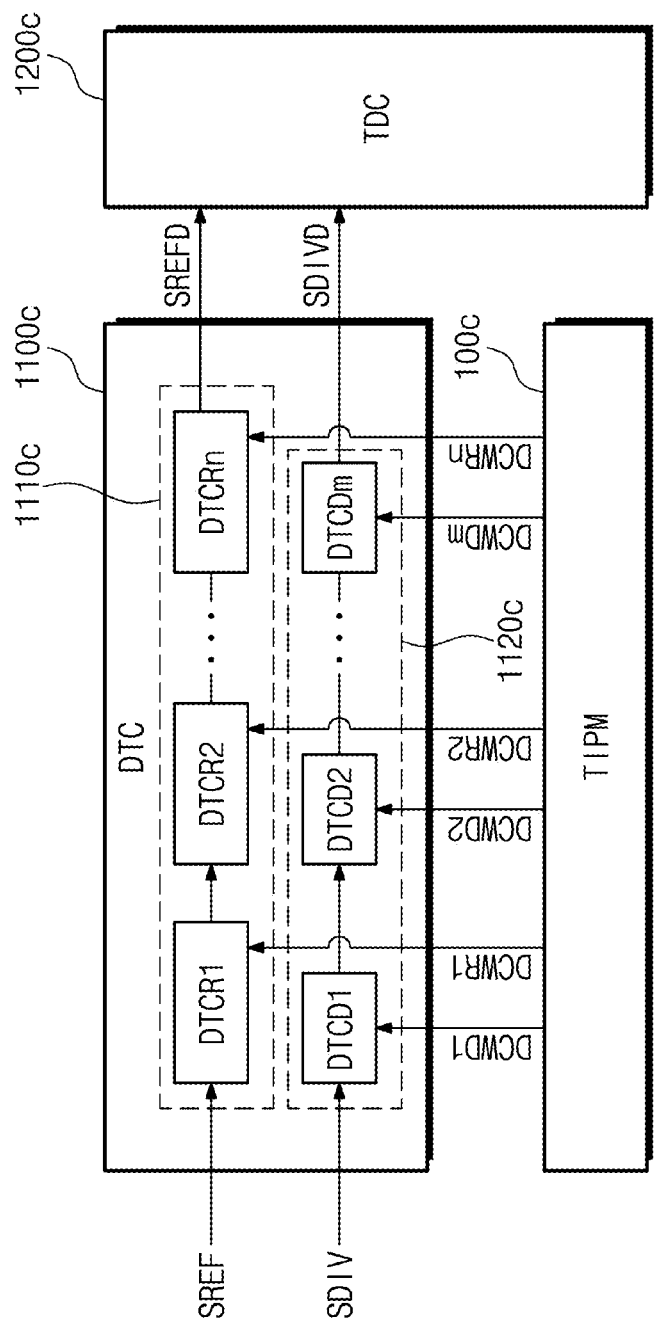
FIG. 2C is a block diagram of a digital-time converter, a time-digital converter, and a time-invariant probability modulator according to another embodiment of the present disclosure.

FIGS. 2A, 2B, and 2C are block diagrams of a digital-time converter, a time-digital converter, and a time-invariant probability modulator according to some embodiments of the present disclosure. Embodiments in which the control codes DCW generated from the TIPM 100 are output to the DTC block 1100 will be more fully described with reference to FIGS. 1, 2A, 2B, and 2C.

In the embodiment illustrated in FIG. 2A, a DTC block 1100a may include a first DTC 1110a and a second DTC 1120a. The first DTC 1110a and the second DTC 1120a may be implemented as a digital-time converter.

The first DTC 1110a may receive the reference signal SREF. The first DTC 1110a may receive a control code DCWR from a TIPM 100a. The first DTC 1110a may output the delayed reference signal SREFD to a TDC 1200a, based on the reference signal SREF and the control code DCWR.

The second DTC 1120a may receive the division signal SDIV. The second DTC 1120a may receive a control code DCWD from the TIPM 100a. The second DTC 1120a may output the delayed division signal SDIVD to the TDC 1200a, based on the reference signal SREF and the control code DCWD.

According to the above description, in the embodiment illustrated in FIG. 2A, the TIPM 100a may generate two control codes DCWR and DCWD. Each of the control codes DCWR and DCWD may be input to the corresponding DTC of the DTC block 1100a. The first DTC 1110a and the second DTC 1120a may operate based on the corresponding control codes, respectively.

In the embodiment illustrated in FIG. 2B, a DTC block 1100b may include a third DTC 1121b and a fourth DTC 1122b. Compared to the embodiment of FIG. 2A where the first DTC 1110a and the second DTC 1120a are disposed in parallel, the third DTC 1121b and the fourth DTC 1122b of FIG. 2B may be disposed in series. Also, compared to the embodiment of FIG. 2A where the first DTC 1110a generates the delayed reference signal SREFD based on the reference signal SREF, in the embodiment illustrated in FIG. 2B, the reference signal SREF may not be delayed in a time domain. In this case, the reference signal SREF may pass the DTC block 1100b and may be provided to a TDC 1200b.

The third DTC 1121b may receive the division signal SDIV. The third DTC 1121b may receive a control code DCWD1 from a TIPM 100b. The third DTC 1121b may generate an analog signal based on the division signal SDIV and the control code DCWD1. The third DTC 1121b may transfer the analog signal thus generated to the fourth DTC 1122b.

The fourth DTC 1122b may receive the analog signal generated by the third DTC 1121b. The fourth DTC 1122b may receive a control code DCWD2 from the TIPM 100b. The fourth DTC 1122b may generate the delayed division signal SDIVD based on the analog signal generated by the third DTC 1121b and the control code DCWD2.

According to the above description, in the embodiment illustrated in FIG. 2B, the TIPM 100b may generate two control codes DCWD1 and DCWD2. Each of the control codes DWCD1 and DWCD2 may be input to the corresponding DTC of the DTC block 1100b. The third DTC 1121b and the fourth DTC 1122b may operate based on the corresponding control codes, respectively.

In the embodiment illustrated in FIG. 2C, a DTC block 1100c may include a first DTC group 1110c and a second DTC group 1120c. Each of the first DTC group 1110c and the second DTC group 1120c may include a plurality of DTCs connected in series.

The first DTC group 1110c may include "n" DTCs (n being an integer more than 1). The DTCs of the first DTC group 1110c may receive a corresponding control code from a TIPM 100c. A delay time of each DTC may be adjusted by the corresponding control code.

The second DTC group 1120c may include "m" DTCs (m being an integer more than 1). The DTCs of the second DTC group 1120c may receive a corresponding control code from the TIPM 100c. A delay time of each DTC may be adjusted by the corresponding control code.

According to the above description, in the embodiment illustrated in FIG. 2C, the TIPM 100c may generate (n+m) control codes DCWR1 to DCWRn and DCWD1 to DCWDn. The control codes DCWR1 to DCWRn and DCWD1 to DCWDn may be respectively input to the corresponding DTCs.

That the TIPM 100 generates various numbers of control codes are described with reference to FIGS. 2A, 2B, and 2C. However, the number of control codes that the TIPM 100 is capable of generating and the number of DTCs that the DTC block 1100 is capable of including are not limited to the above embodiments.

Figure 3:
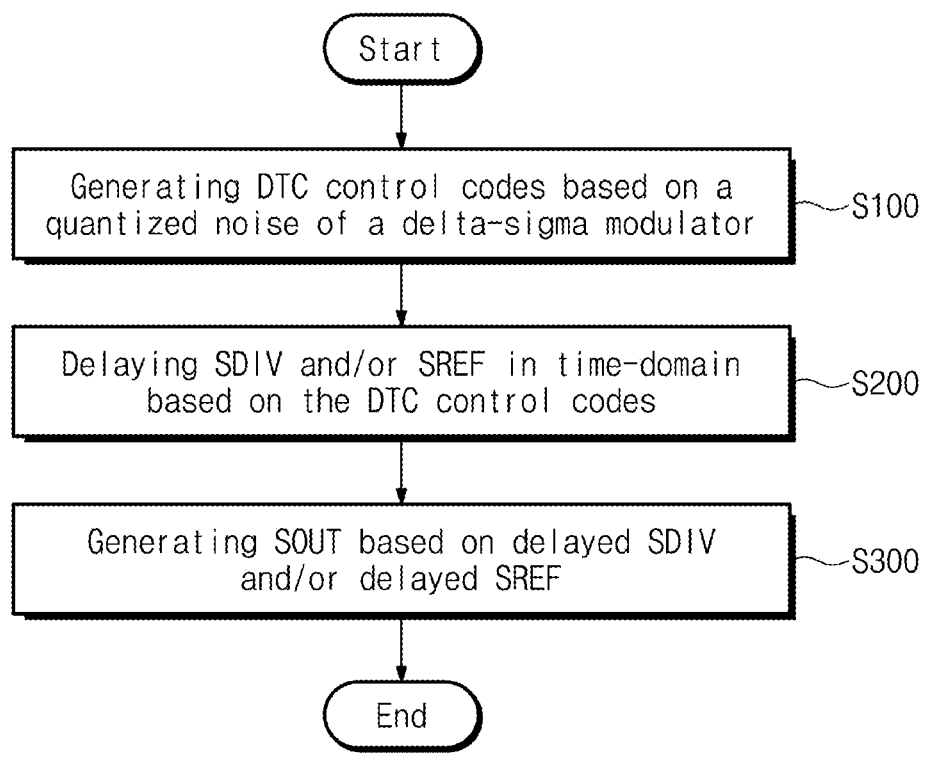
FIG. 3 is a flowchart of an operating method of an integrated circuit of FIG. 1.

FIG. 3 is a flowchart of an operating method of an integrated circuit of FIG. 1. Referring to FIGS. 1 and 3, the integrated circuit 1000 may perform operation S100 to operation S300.

In operation S100, the integrated circuit 1000 may generate control codes for controlling a digital-time converter, based on a quantized noise of the delta-sigma modulator 1600. For example, the TIPM 100 of the integrated circuit 1000 may generate the control codes DCW based on the quantized noise signal DAQ. Probability density functions of the control codes DCW may be time-invariant. Also, a linear combinations of the control codes DCW may correspond to the quantized noise signal DAQ.

In operation S200, the integrated circuit 1000 may delay the division signal SDIV and/or the reference signal SREF in a time domain, based on the control codes DCW. For example, the DTC block 1100 of the integrated circuit 1000 may generate the delayed division signal SDIVD and/or the delayed reference signal SREFD by delaying the division signal SDIV and/or the reference signal SREF in a time domain as much as a given time, based on the control codes DCW.

In operation S300, the integrated circuit 1000 may generate the output signal SOUT based on the delayed division signal SDIVD and/or the delayed reference signal SREFD. For example, the TDC 1200 of the integrated circuit 1000 may generate the comparison signal DTDC based on the delayed division signal SDIVD and the delayed reference signal SREFD. The digital loop filter 1300 may filter the comparison signal DTDC and may transfer the filtered signal to the DCO 1400. The DCO 1400 may generate the output signal SOUT based on the filtered signal.

As operation S100 to operation S300 are performed, the quantized noise signal DAQ generated from the delta-sigma modulator 1600 may be applied to the feedback loop of the integrated circuit 1000 through the TIPM 100. As a bandwidth of the feedback loop of the integrated circuit 1000 decreases, the quantized noise signal DAQ in a high frequency band may be further filtered by the feedback loop. However, in this case, a noise of the DCO 1400 may not be sufficiently filtered. As a result, the integrated circuit 1000 may fail to satisfy a low-jitter characteristic. In contrast, as the bandwidth of the feedback loop increases, a noise of the DCO 1400 may be further filtered, but the quantized noise signal DAQ may not be sufficiently filtered. That is, in determining the bandwidth of the feedback loop, there may be a trade-off between the filtering of the quantized noise signal DAQ and the noise filtering of the DCO 1400. The quantized noise signal DAQ that is not filtered (or remains) may cause the reduction of a phase noise characteristic of the integrated circuit 1000 in a high-frequency offset frequency band. As such, the performance of the integrated circuit 1000 may become worse.

To cancel out the quantized noise signal DAQ sufficiently, the DTC block 1100 may operate in response to the control codes DCW associated with the quantized noise signal DAQ. In an embodiment, the DTC block 1100 may linearly determine a delay time based on the control codes DCW. The DTC block 1100 may delay the reference signal SREF and the division signal SDIV in a time domain as much as the determined delay time. The DTC block 1100 may provide the delayed reference signal SREFD and the delayed division signal SDIVD to the TDC 1200. The delayed reference signal SREFD and the delayed division signal SDIVD may be signals where the quantized noise signal DAQ is sufficiently canceled out.

In some embodiments, the DTC block 1100 may determine a delay time non-linearly. As described above, the TIPM 100 may generate the control codes DCW having a time-invariant probability density function. Because a time-invariant characteristic of probability density functions of the control codes DCW is maintained even though distortion occurs due to non-linearity of the DTC block 1100, a probability density function of the delay time determined by the DTC block 1100 may also be time-invariant. Accordingly, the delay time determined by the DTC block 1100 may not include a fractional spur.

The TIPM 100 of the integrated circuit 1000 may compensate for the non-linearity of the DTC block 1100 by generating the time-invariant control codes DCW based on the quantized noise signal DAQ. As such, even though the DTC block 1100 has a non-linear characteristic, a signal including a fractional spur may not be introduced to the TDC 1200. Because a signal including a fractional spur is not introduced to the feedback loop, a fractional spur may not occur at the output signal S OUT. Accordingly, the performance of the integrated circuit 1000 may be improved.

In some embodiments, the DCO 1400 may be implemented as a ring oscillator instead of an LC oscillator. The ring oscillator may occupy the area smaller than the LC oscillator but may have a higher noise characteristic than the LC oscillator. The TIPM 100 may provide the feedback loop of the integrated circuit 1000 with the control codes DCW where the probability density functions are modulated. Because the probability density functions of the control codes DCW are time-invariant, even though the distortion occurs due to the non-linearity of the DTC block 1100, a fractional spur may not occur. Accordingly, even though a bandwidth of the feedback loop further increases (i.e., even though the integrated circuit 1000 is referred to as a "wideband PLL"), a low-noise characteristic may be satisfied, and a low fractional spur characteristic may be obtained. As a result, due to the TIPM 100, the integrated circuit 1000 may occupy the less area, and the performance of the integrated circuit 1000 may be improved.

Figure 4:
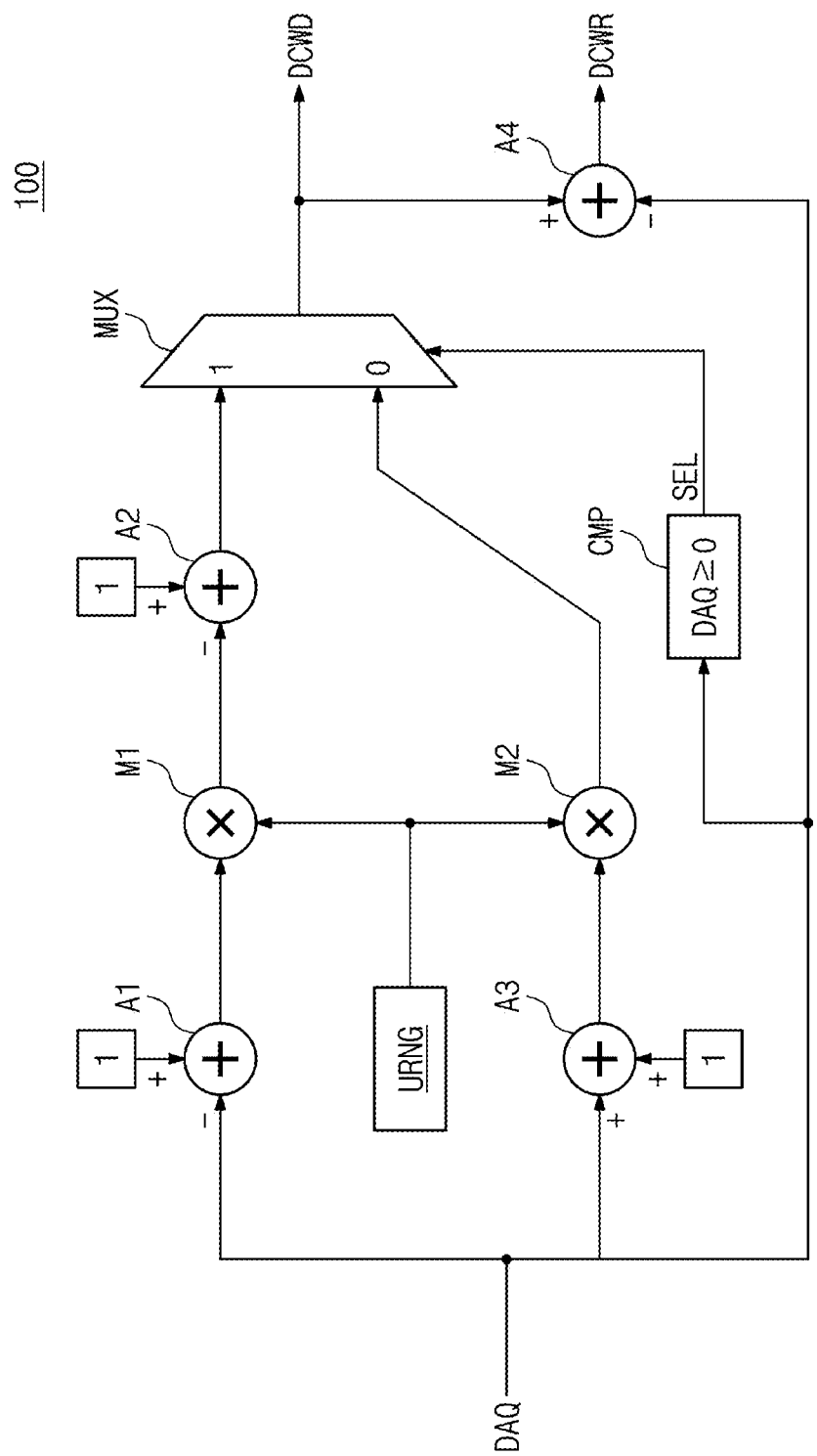
FIG. 4 is a block diagram of a time-invariant probability modulator of FIG. 1.

FIG. 4 is a block diagram of a time-invariant probability modulator of FIG. 1. Referring to FIGS. 1 and 4, the TIPM 100 may include adders A1 to A4, multipliers M1 and M2, a uniform random number generator URNG, a comparator CMP, and a multiplexer MUX.

In the embodiment illustrated in FIG. 4, the TIPM 100 may generate the control codes DCW for compensating for the quantized noise signal DAQ generated by the delta-sigma modulator 1600 implemented as the MASH 11. In this case, due to a characteristic of the MASH 11, a probability density function of the quantized noise signal DAQ may be expressed as a triangular function distributed in an interval [−1, 1]. The control codes DCWR and DWCD generated by the TIPM 100 may be respectively input to the first DTC 1110a and the second DTC 1120a of the DTC block 1100a of FIG. 2A.

The uniform random number generator URNG may generate a random number following a uniform distribution. For example, the uniform random number generator URNG may generate random numbers that are uniformly distributed in an interval [0, 1]. The uniform random number generator URNG may provide the generated random number to the multipliers M1 and M2.

The adder A1 may perform an addition operation on integer 1 and a negative number of the quantized noise signal DAQ. The multiplier M1 may perform a multiplication operation on an operation result of the adder A1 and a random number output from the uniform random number generator URNG. The adder A2 may perform an addition operation on integer 1 and a negative number of an operation result of the multiplier M1. An operation result of the adder A2 may be input to the multiplexer MUX.

The adder A3 may perform an addition operation on integer 1 and the quantized noise signal DAQ. The multiplier M2 may perform a multiplication operation on an operation result of the adder A3 and the random number output from the uniform random number generator URNG. An operation result of the multiplier M2 may be input to the multiplexer MUX.

The comparator CMP may determine a sign of the quantized noise signal DAQ. For example, the comparator CMP may determine whether a value of the quantized noise signal DAQ is equal to or more than "0". The comparator CMP may output a selection signal SEL, which is based on a comparison result, to the multiplexer MUX. When the value of the quantized noise signal DAQ is equal to or more than "0", the selection signal SEL may correspond to input "1" of the multiplexer MUX. If not, the selection signal SEL may correspond to input "0" of the multiplexer MUX.

The multiplexer MUX may output one of the operation result of the adder A2 and the operation result of the multiplier M2 as the control code DCWD in response to the selection signal SEL. The control code DCWD output from the multiplexer MUX may be transferred to the adder A4 and the second DTC 1120a of the DTC block 1100a.

The adder A4 may perform an addition operation on the control code DCWD and the negative number of the quantized noise signal DAQ. The adder A4 may output the control code DCWR that is based on a result of the addition operation. The control code DCWR output from the adder A4 may be transferred to the first DTC 1110a of the DTC block 1100a.

The control codes DCWD and DCWR generated by the TIPM 100 may be expressed as follows.

$$DCWD = \begin{cases} 1 - (1 - DAQ) * Unif[0, 1], & DAQ \geq 0 \\ (1 + DAQ) * Unif[0, 1], & DAQ < 0 \end{cases} \quad \text{[Equation 2]}$$

$$DCWR = DCWD - DAQ \quad \text{[Equation 3]}$$

By summarizing Equation 2 and Equation 3, the control codes DCWD and DCWR may be expressed more simply as follows.

$$DCWD = \begin{cases} Unif[DAQ, 1], & DAQ \geq 0 \\ Unif[0, DAQ + 1]. & DAQ < 0 \end{cases} \quad \text{[Equation 4]}$$

$$DCWR = \begin{cases} Unif[0, 1 - DAQ], & DAQ \geq 0 \\ Unif[-DAQ, 1], & DAQ < 0 \end{cases} \quad \text{[Equation 5]}$$

It is confirmed from Equation 4 and Equation 5 that the control codes DCWD and DCWR generated by the TIPM 100 follow a uniform distribution regardless of the quantized noise signal DAQ. Accordingly, the probability density function of the control code DCWD and the probability density function of the control code DCWR may be time-invariant. Also, referring to Equation 3, a difference between the control code DCWD and the control code DCWR may correspond to the quantized noise signal DAQ. In other words, the control codes DCWD and DCWR may be generated such that a linear combination of the control codes DCWD and DCWR corresponds to the quantized noise signal DAQ.

A way to generate two control codes DCWD and DCWR, which correspond to the quantized noise signal DAQ output from the delta-sigma modulator 1600 implemented as the MASH 11, by utilizing a uniform random number is described with reference to FIGS. 1, 2A, and 4 by way of example. However, the present disclosure is not limited thereto.

Figure 5:
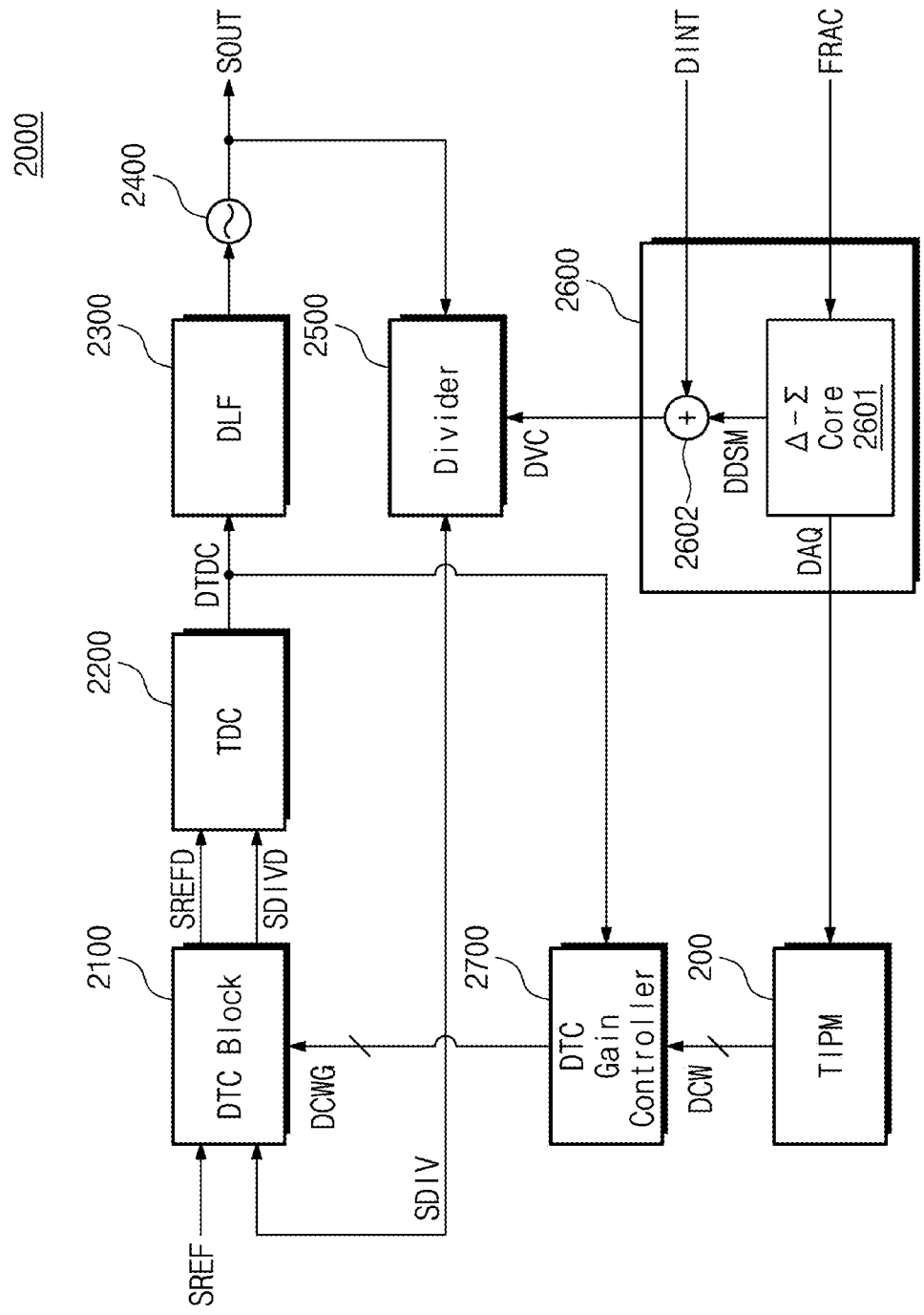
FIG. 5 is a block diagram of an integrated circuit according to another embodiment of the present disclosure.

FIG. 5 is a block diagram of an integrated circuit according to another embodiment of the present disclosure. A difference between the integrated circuit 1000 of FIG. 1 and an integrated circuit 2000 of FIG. 5 will be described with reference to FIGS. 1 and 5.

The integrated circuit 2000 of FIG. 5 may include a DTC block 2100, a TDC 2200, a digital loop filter 2300, a DCO 2400, a divider 2500, a delta-sigma modulator 2600, a TIPM 200, and a DTC gain controller 2700. The TDC 2200, the digital loop filter 2300, the DCO 2400, the divider 2500, the delta-sigma modulator 2600, and the TIPM 200 may be implemented to be similar to the TDC 1200, the digital loop filter 1300, the DCO 1400, the divider 1500, the delta-sigma modulator 1600, and the TIPM 100 of the integrated circuit 1000 of FIG. 1 and may operate in a manner similar to that thereof.

Compared with the integrated circuit 1000 of FIG. 1, the integrated circuit 2000 of FIG. 5 may further include the DTC gain controller 2700. The DTC gain controller 2700 may receive the control codes DCW from the TIPM 200. The DTC gain controller 2700 may adjust the control codes DCW. The DTC gain controller 2700 may transfer an adjusted control codes DCWG to the DTC block 2100. The DTC block 2100 may operate based on the adjusted control codes DCWG.

The DTC gain controller 2700 may control a gain of the DTC block 1100 by providing the adjusted control codes DCWG to the DTC block 2100. For example, to completely block the quantized noise signal DAQ, the DTC gain controller 2700 may adjust the control codes DCW such that a gain of the DTC block 2100 is the same as a period of the output signal SOUT of the DCO 2400 and a ratio between the control codes DCW. In an embodiment, the DTC gain controller 2700 may adjust the gain of the DTC block 2100 by using various algorithms such as an LMS algorithm. For example, the DTC gain controller 2700 may adjust the gain of the DTC block 2100 until a cross-correlation coefficient between the comparison signal DTDC output from the TDC 2200 and the comparison signal DTDC is close to "0". As such, the performance of the integrated circuit 2000 may be improved.

Figure 6:
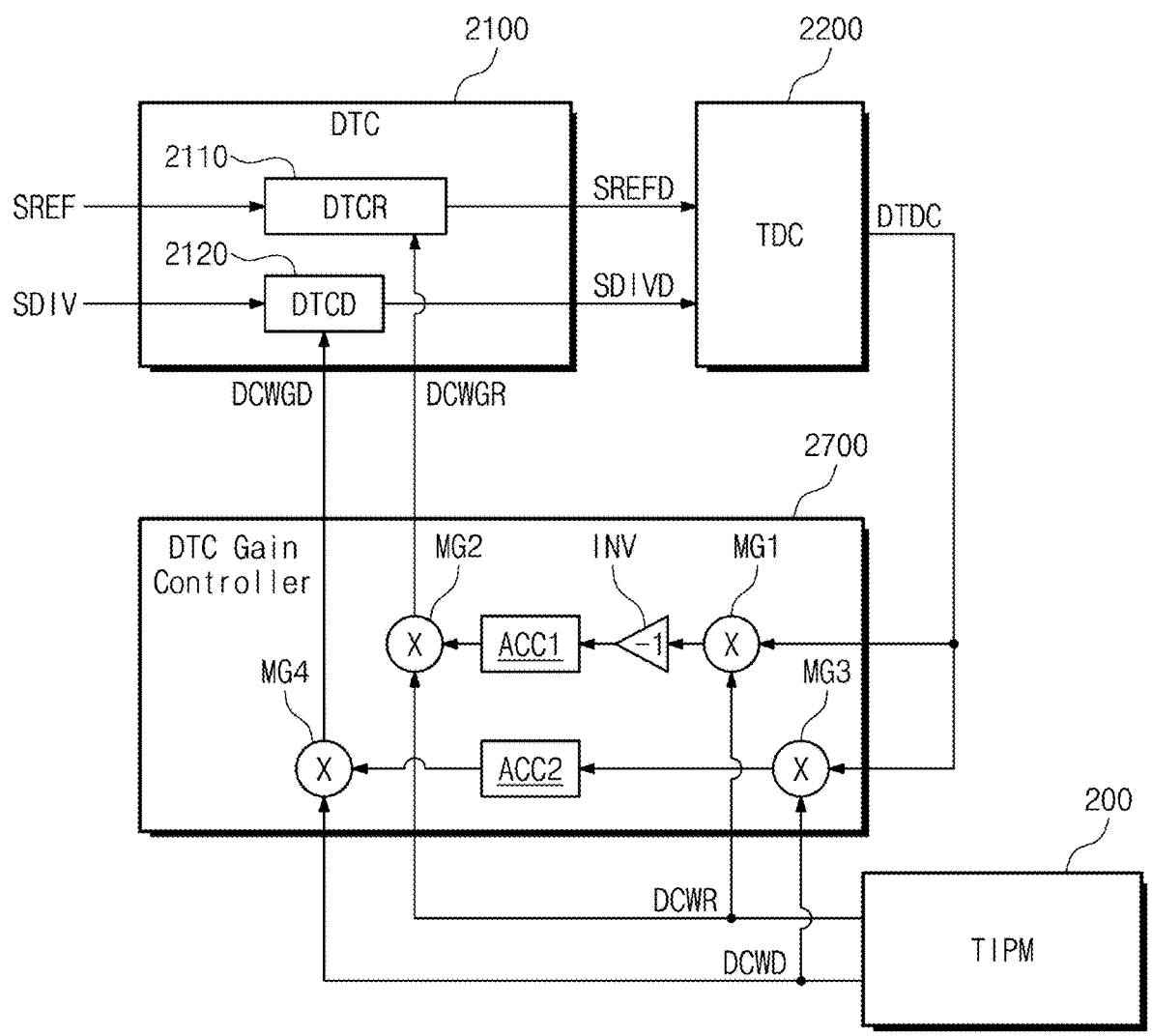
FIG. 6 is a block diagram of a digital-time converter, a time-digital converter, a time-invariant modulator, and a digital-time converter gain controller of FIG. 5

FIG. 6 is a block diagram of a digital-time converter, a time-digital converter, a time-invariant modulator, and a digital-time converter gain controller of FIG. 5. Referring to FIGS. 2A, 5, and 6, the DTC gain controller 2700 may include multipliers MG1 to MG4, accumulators ACC1 and ACC2, and an inverter INV. A configuration and an operation of the DTC block 2100 may be similar to those of the DTC block 1100a of FIG. 2A.

The multiplier MG1 may receive the comparison signal DTDC from the TDC 2200. The multiplier MG1 may receive the control code DCWR from the TIPM 200. The multiplier MG1 may perform a multiplication operation on the comparison signal DTDC and the control code DCWR. The inverter INV may invert a signal corresponding to an operation result of the multiplier MG1. The accumulator ACC1 may accumulate the signal inverted by the inverter INV. The multiplier MG2 may perform a multiplication operation on the signal accumulated by the accumulator ACC1 and the control code DCWR. The multiplier MG2 may output a result of the multiplication operation to a converter 2110 of the DTC block 2100 as a control code DCWGR.

The multiplier MG3 may receive the comparison signal DTDC from the TDC 2200. The multiplier MG3 may receive the control code DCWD from the TIPM 200. The multiplier MG3 may perform a multiplication operation on the comparison signal DTDC and the control code DCWD. The accumulator ACC2 may accumulate an operation result of the multiplier MG3. The multiplier MG4 may perform a multiplication operation on the signal accumulated by the accumulator ACC2 and the control code DCWD. The multiplier MG4 may output a result of the multiplication operation to a converter 2120 of the DTC block 2100 as a control code DCWGD.

The adjusted control code DCWGR that is associated with a cross-correlation coefficient between the control code DCWR and the comparison signal DTDC may be provided to the DTC block 2100 through the multiplier MG1, the inverter INV, the accumulator ACC1, and the multiplier MG2. The adjusted control code DCWGD that is associated with a cross-correlation coefficient between the control code DCWD and the comparison signal DTDC may be provided to the DTC block 2100 through the multiplier MG3, the accumulator ACC2, and the multiplier MG4. As such, unlike the DTC block 1100 of FIG. 1, a gain of the DTC block 2100 may be adjusted.

Figure 7:
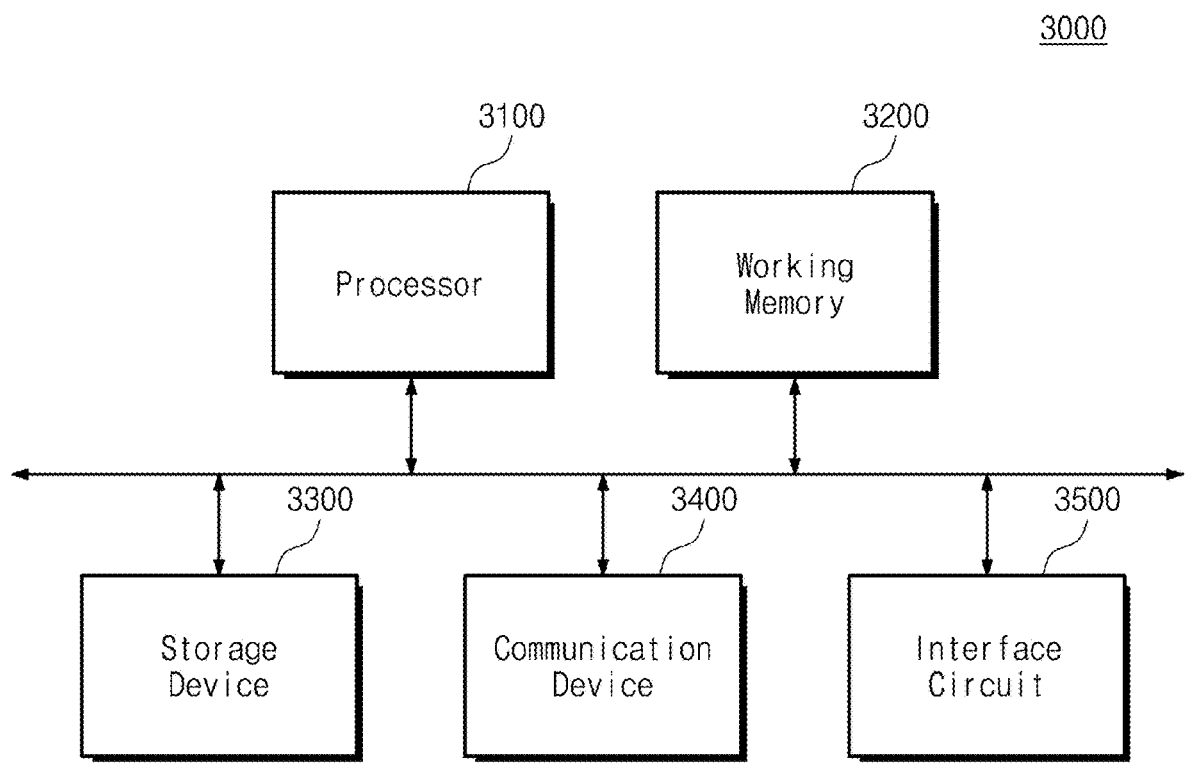
FIG. 7 is a block diagram of an electronic device according to an embodiment of the present disclosure.

FIG. 7 is a block diagram of an electronic device according to an embodiment of the present disclosure. Referring to FIG. 7, an electronic device 3000 may include a processor 3100, a working memory 3200, a storage device 3300, a communication device 3400, and an interface circuit 3500.

The processor 3100 may function as a central processing unit of the electronic device 3000. For example, the processor 3100 may include one or more processor cores capable of performing various operations. The core(s) may be implemented as a central processing unit (CPU), a digital signal processing unit (DSP), or a graphics processing unit (GPU).

The working memory 3200 may store data, which are processed or are to be processed by the processor 3100, and program codes. The working memory 3200 may function as a main memory device of the electronic device 3000. The working memory 3200 may be implemented as a dynamic random access memory (DRAM) or a static random access memory (SRAM). The working memory 3200 may be referred to as a "buffer memory" or a "cache memory".

The storage device 3300 may function as an auxiliary memory device of the electronic device 3000. The storage device 3300 may include a nonvolatile memory device such as a read-only memory or a solid state drive (SSD). Data stored in the storage device 3300 may be provided to the processor 3100 through a bus.

The communication device 3400 may communicate with an external device of the electronic device 3000 in a wired or wireless manner. The communication device 3400 may receive data for an operation of the electronic device 3000 from the external device. The communication device 3400 may transmit the data generated by the processor 3100 to the external device.

The communication device 3400 may include the integrated circuit 1000 of FIG. 1 or the integrated circuit 2000 of FIG. 5. Based on the output signal SOUT output from the integrated circuit 1000/2000, the communication device 3400 may generate signals having various frequencies and may modulate or demodulate the generated signals. For example, the output signal SOUT may have a frequency included in an ultra-high-frequency band such as a millimeter wave band and may simultaneously satisfy a low-noise characteristic. As such, the performance of the communication device 3400 may be improved.

The interface circuit 3500 may include various input/output devices for communicating with the external device. For example, the interface circuit 3500 may include at least one of various output devices such as a monitor, a printer, and a lamp. The interface circuit 3500 may include at least one of various input devices such as a keyboard, a touch pad, a mouse, and a microphone.

In the above embodiments, components according to embodiments of the present disclosure are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

An integrated circuit according to an embodiment of the present disclosure may include a time-invariant probability modulator and a plurality of digital-time converters. Based on a quantized noise of a delta-sigma modulator, the time-invariant probability modulator may generate a plurality of control codes whose probability density functions are time-invariant and which are used to control the plurality of digital-time converters. As such, a spur coming from the non-linearity of the digital-time converters may decrease.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An integrated circuit comprising:
    a digital-to-time converter (DTC) block including a plurality of DTCs, which receives a first reference signal and a first division signal and outputs a second reference signal and a second division signal based on the first reference signal, the first division signal, and a plurality of control codes;
    a time-to-digital converter (TDC) which compares a phase of the second reference signal and a phase of the second division signal and outputs a comparison signal;
    a digital loop filter which filters the comparison signal;
    an oscillator which generates an output signal based on the filtered comparison signal;
    a delta-sigma modulator which outputs a first signal and a quantized noise signal based on a first division ratio signal and a second division ratio signal;
    a divider which divides a frequency of the output signal based on the first signal and outputs the first division signal; and
    a probability modulator which generates the plurality of control codes based on the quantized noise signal,
    wherein probability density functions of the plurality of control codes are time-invariant.

2. The integrated circuit of claim 1, wherein a linear combination of the plurality of control codes corresponds to the quantized noise signal.

3. The integrated circuit of claim 1, wherein the oscillator includes a ring oscillator.

4. The integrated circuit of claim 1, wherein the DTC block includes a first DTC and a second DTC,
    wherein the first DTC delays the first reference signal in a time domain during a first delay time in response to a first control code of the plurality of control codes, and
    wherein the second DTC delays the first division signal in the time domain during a second delay time in response to a second control code of the plurality of control codes.

5. The integrated circuit of claim 1, wherein the DTC block includes a first DTC and a second DTC connected in series,
wherein the first DTC delays the first division signal in a time domain during a first delay time in response to a first control code of the plurality of control codes and outputs a first intermediate signal, and
wherein the second DTC delays the first intermediate signal in the time domain during a second delay time in response to a second control code of the plurality of control codes.

6. The integrated circuit of claim 1, wherein the probability modulator includes a uniform random number generator, and
wherein the probability modulator generates the plurality of control codes based on a uniform random number generated from the uniform random number generator.

7. The integrated circuit of claim 1, wherein the plurality of control codes include a first control code and a second control code,
wherein a probability density function corresponding to the first control code from among the plurality of probability density functions and a probability density function corresponding to the second control code from among the plurality of probability density functions follow a uniform distribution follow a uniform distribution, and
wherein a difference between the first control code and the second control code corresponds to the quantized noise signal.

8. The integrated circuit of claim 1, further comprising:
a DTC gain controller which modulates the plurality of control codes and provides the plurality of modulated control codes to the DTC block,
wherein the DTC block operates based on the plurality of modulated control codes.

9. An electronic device comprising:
a processor; and
a communication device which receives data from the outside under control of the processor, wherein the communication device includes:
a delta-sigma modulator which outputs a first signal and a quantized noise signal based on a first division ratio signal and a second division ratio signal;
a probability modulator which generates a plurality of control codes based on the quantized noise signal;
a digital-to-time converter (DTC) block including a plurality of DTCs, the DTC block which receives a first reference signal and a first division signal and outputs a second reference signal and a second division signal based on the first reference signal, the first division signal, and the plurality of control codes;
a time-to-digital converter (TDC) which compares a phase of the second reference signal and a phase of the second division signal and outputs a comparison signal;
a digital loop filter which filters the comparison signal;
an oscillator which generates an output signal based on the filtered comparison signal; and
a circuit block which receives the first signal and the output signal and generates the first division signal from the output signal in response to the first signal,
wherein probability density functions of the plurality of control codes are time-invariant.

10. The electronic device of claim 9,
wherein a linear combination of the plurality of control codes corresponds to the quantized noise signal.

11. The electronic device of claim 9, wherein the plurality of control codes include a first control code and a second control code,
wherein a probability density function corresponding to the first control code from among the plurality of probability density functions and a probability density function corresponding to the second control code from among the plurality of probability density functions follow a uniform distribution follow a uniform distribution, and
wherein a difference between the first control code and the second control code corresponds to the quantized noise signal.

12. The electronic device of claim 9, wherein the circuit block includes one of a multi-modulus divider (MMD) and a phase selector.

13. The electronic device of claim 9, further comprising:
a DTC gain controller which modulates the plurality of control codes and provides the plurality of modulated control codes to the DTC block,
wherein the DTC block operates based on the plurality of modulated control codes.

14. The electronic device of claim 9, wherein the probability modulator includes a uniform random number generator, and
wherein the probability modulator generates the plurality of control codes based on a uniform random number generated from the uniform random number generator.

15. A method comprising:
generating a plurality of control codes based on a first signal associated with a quantized noise of a delta-sigma modulator;
delaying a reference signal and a division signal in a time domain based on the plurality of control codes, respectively; and
generating an output signal based on the delayed reference signal and the delayed division signal,
wherein probability density functions of the plurality of control codes are time-invariant.

16. The method of claim 15,
wherein a linear combination of the plurality of control codes corresponds to the quantized noise.

17. The method of claim 15, wherein the plurality of control codes include a first control code and a second control code, and
wherein the generating of the plurality of control codes includes:
generating a first intermediate code and a second intermediate code based on the first signal and a uniform distribution function;
determining one of the first intermediate code and the second intermediate code as the second control code based on a sign of the first signal; and
generating the first control code being a difference between the second control code and the first signal.

18. The method of claim 17, wherein the delaying of the reference signal and the division signal includes:
delaying the reference signal in the time domain as much as a first delay time, based on the first control code; and
delaying the division signal in the time domain as much as a second delay time, based on the second control code.

19. The method of claim 17, wherein the generating of the output signal further includes comparing a phase of the delayed reference signal and a phase of the delayed division signal, and wherein the delaying of the reference signal and the division signal in the time domain based on the plurality of control codes respectively includes:

modulating the first control code and the second control code based on a comparison signal corresponding to a result of comparing the phase of the delayed reference signal and the phase of the delayed division signal;

delaying the reference signal in the time domain as much as a first delay time, based on the first control code thus modulated; and delaying the division signal in the time domain as much as a second delay time, based on the second control code thus modulated.

20. The method of claim 19, wherein the modulating of the first control code and the second control code based on the comparison signal corresponding to the result of comparing the phase of the delayed reference signal and the phase of the delayed division signal includes:

calculating a first value being a product of the comparison signal and the first control code;

inverting the first value;

generating a second value by accumulating the first signal thus inverted;

calculating a product of the second value and the first control code;

calculating a third value being a product of the comparison signal and the second control code;

generating a fourth value by accumulating the third signal; and calculating a product of the fourth value and the second control code.

* * * * *